United States Patent [19]

Seger

[11] Patent Number: 5,270,874
[45] Date of Patent: Dec. 14, 1993

[54] DROPOUT SIMULATION IN A MAGNETIC TAPE SUBSYSTEM

[75] Inventor: Paul J. Seger, Tucson, Ariz.

[73] Assignee: International Business Machines Corporation, Armonk, N.Y.

[21] Appl. No.: 655,492

[22] Filed: Feb. 14, 1991

[51] Int. Cl.⁵ ............................................. H04N 5/14
[52] U.S. Cl. ..................................... 360/31; 360/38.1
[58] Field of Search ................... 360/31, 38.1; 369/53; 324/212; 307/520; 328/167

[56] References Cited

U.S. PATENT DOCUMENTS

| | | | |
|---|---|---|---|
| 3,522,525 | 8/1970 | Cottin et al. | 324/212 |
| 4,081,756 | 3/1978 | Price et al. | 360/45 |
| 4,686,563 | 8/1987 | Fountain et al. | 360/38.1 |
| 4,777,544 | 10/1988 | Brown et al. | 360/75 |
| 4,812,923 | 3/1989 | Fountain et al. | 324/212 |
| 5,172,280 | 12/1992 | Quintuc et al. | 360/31 |

OTHER PUBLICATIONS

E. C. Klaas, "Testing Magnetic Recording Tape," Nov. 1965, IBM Tech. Discl. Bulletin, vol. 8, No. 6, p. 828.
H. J. Gardner, et al., "Signal Quality Measurements," Oct. 1978, IBM Tech. Discl. Bulletin, vol. 21, No. 5, pp. 1801–1802.
K. H. Jeffries, et al., "Head-Tape Spacing Meter," Jun. 1973, IBM Tech. Discl. Bulletin, vol. 16, No. 1, pp. 269–270.
R. L. Wallace, Jr., "The Reproduction of Magnetically Recorded Signals," Jul. 1951, pp. 1145–1173.

*Primary Examiner*—Robert J. Pascal
*Assistant Examiner*—Tan Dinh
*Attorney, Agent, or Firm*—M. W. Schecter; C. B. Lobsenz

[57] ABSTRACT

The invention is a magnetic tape subsystem in which dropout can be controllably simulated. Such simulation is accomplished by inserting an electronic filter between the read transducer and a recording channel detector of the magnetic tape subsystem. The filter scales a spacing loss transfer function from a spatial domain to a frequency domain. After selecting an appropriate head-tape spacing, the frequency domain transfer function is computed and the filter is designed. Upon insertion of the filter, dropout is then simulated. Such simulation allows for an assessment of recording channel operation with a particular amount of dropout, including the margin to failure of magnetic tape heads or other components. Because the filter is completely electronic, dropout simulation can be performed in the field for maintenance purposes as well as to test recording channels during their development and manufacture.

12 Claims, 2 Drawing Sheets

DROPOUT SIMULATION IN A MAGNETIC TAPE SUBSYSTEM

BACKGROUND OF THE INVENTION

Field of the Invention

This invention relates to the controlled simulation of dropout in a magnetic tape subsystem. More particularly, the invention is a magnetic tape subsystem employing an electronic filter in a recording channel of a magnetic tape drive for controllably simulating dropout.

Description of the Related Art

Magnetic tape subsystems include various components for causing a magnetic tape head to write to and read from a magnetic tape. Some components are mechanical, such as tape bearing surfaces, tape guides, tape reels, and means for driving the reels to cause the tape to be transferred from one reel to the other. These components may be located in a magnetic tape drive, or in a cartridge housing the magnetic tape. Other components are electrical, including much of a recording (or data) channel, such as the write and read circuits. A channel is simply a path along which signals can be transmitted. The recording channel is the path between a data format control and the magnetic tape. Within the recording channel, a write signal is delivered to a magnetic write transducer of a tape head for recording data on the magnetic tape and a read signal is generated by a magnetic read transducer of a tape head. A single tape head may include both the write transducer and the read transducer, or separate heads may be used. The recording channel includes the write circuits, write transducer, magnetic tape, read transducer, and read circuits, as will be described later herein.

During the development, manufacture, and operation of magnetic tape subsystems it is necessary to evaluate the quality of the recording channel components. Such evaluation is known to be performed in a laboratory using testing hardware. For example, a magnetic tape head may be placed in a subsystem to measure its error performance. Examples of such measurements are provided in U.S. Pat. No. 3,522,525; Klaas, IBM Technical Disclosure Bulletin, Vol. 8 No. 6, November, 1965, p. 828; and Cardner et al, TBM Technical Disclosure Bulletin, Vol. 21, No. 5, October, 1978. pp. 1801–02. Recording channels can be evaluated by injecting noise under otherwise nominal conditions until the error rate of the subsystem reaches a designated level. The amount of noise required to reach the designated error rate can thus be used as a system specification. Unfortunately, the effect of noise upon the read signal is random and does not simulate the primary failure mechanism in the recording channel.

The primary failure mechanism in the recording channel is dropout, which is a degradation of the read signal resulting from a tape defect or change in the head-tape spacing (i.e. head-tape separation), as might be caused by particulates in the tape path.

Dropout results in a change in the power spectral density of the read signal which cannot be replicated by injecting noise or other signals into the channel. The power spectral density of the read signal can be expressed according to a Wallace exponential spacing loss function:

$$G(D) = e^{-\pi DS} \tag{1}$$

where G(D) is a transfer function as a function of recording density D in flux changes per micron which results from a physical spacing S in microns. Further description of equation 1 can be found in Wallace, Jr., "The Reproduction of Magnetically Recorded Signals," Bell Systems Technical Journal, Vol. 30, 1951, hereby incorporated by reference. It is known that equation 1 may be fit to signals obtained from a calibrated head to estimate the head-tape spacing, as in Jeffries et al., IBM Technical Disclosure Bulletin, Vol. 16, No. 1, June, 1973, pp. 269-70. It is also known that read signals degraded by dropout may be captured for failure analysis.

A heretofore unrecognized problem, however, is the lack of precise control of the head-tape spacing, making it difficult to predict the effect of dropout on the recording channel. To test the susceptibility of a subsystem to dropout, it would be necessary to introduce a controlled head-tape spacing during operation. However, because the actual head-tape separation which causes dropout is extremely small (and becoming smaller as recording densities continually increase), it is very difficult to controllably introduce such separation in laboratory investigations despite the use of special instrumentation. In addition, in normal operation in the field, it is impossible to controllably introduce such separations.

It is therefore desirable to simulate dropout in a controlled manner to assess the capability of the recording channel to function with such dropout.

SUMMARY OF THE INVENTION

In view of the foregoing, it is the principal object of this invention to provide an improved method and apparatus for assessing the capability of recording channels.

Another object of this invention is a method and apparatus for assessing the capability of recording channels during development, manufacturing, and in the field.

Yet another object of this invention is the controlled simulation of dropout in a magnetic tape subsystem.

These and other objects of this invention are accomplished by inserting an electronic filter between the read transducer and the recording channel detector of a magnetic tape subsystem. The filter scales the spacing loss transfer function from a spatial domain to a frequency domain. After selecting an appropriate head-tape spacing, including the additional spacing due to dropout, a frequency domain transfer function is computed and the filter required is designed. Upon insertion of the filter, dropout is simulated. Such simulation allows for an assessment of recording channel operation with a particular amount of dropout, including the margin to failure of magnetic tape heads. Because the filter is completely electronic, dropout simulation can be performed in the field for maintenance purposes as well as to test recording channels during their development and manufacture.

The foregoing and other objects, features, and advantages of the invention will be apparent from the following more particular description of the preferred embodiment of the invention, as illustrated in the accompanying drawings.

DESCRIPTION OF THE PREFERRED EMBODIMENT

Figure 1:
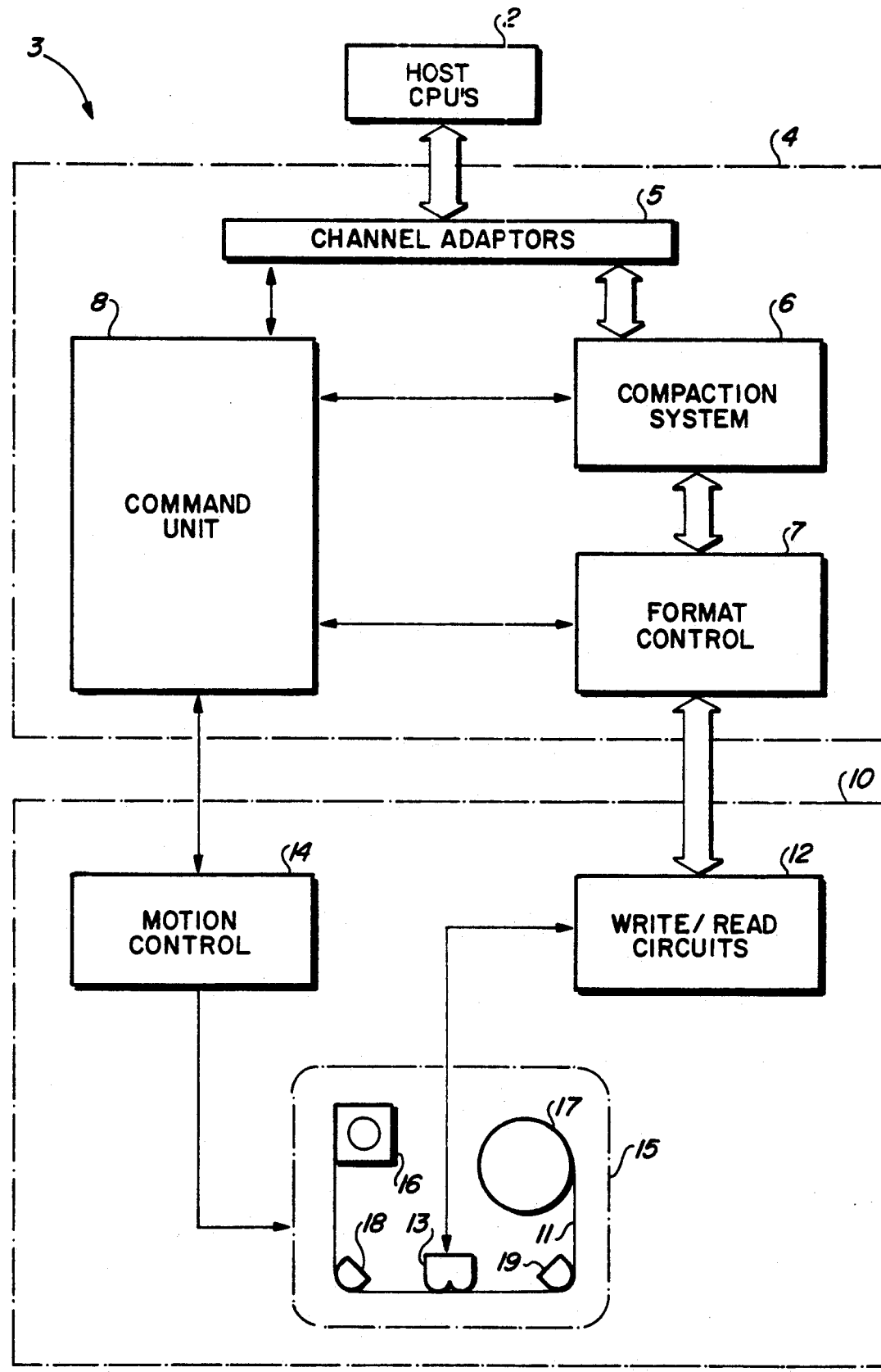
FIG. 1 is a schematic block diagram of a data processing system employing the invention.

Referring now more particularly to the drawing, like numerals denote like features and structural elements in the various figures. The invention will be described as embodied in a data processing system including a magnetic tape subsystem. Referring to FIG. 1, a data processing system is controlled by one or more host central processing units 2 to store and retrieve data that is required by such hosts. The data is stored in and retrieved from a magnetic tape subsystem 3, including control unit 4 and magnetic tape drive 10. In the preferred embodiment, subsystem 3 is an IBM 3490 Magnetic Tape Subsystem.

Hosts 2 exchange data with and issue commands to subsystem 3. Data is the actual information written to and read from the magnetic tape 11. Commands are used to control the operation of subsystem 3. Data and commands are accepted from hosts 2 by one or more host channel adaptors 5. Data is exchanged between channel adaptors 5, a compaction system 6, a format control 7, the write/read circuits 12, a magnetic tape head 13, and magnetic tape 11. Compaction system 6 compacts and decompacts the data for storage on and retrieval from tape 11 respectively. In alternative embodiments, compaction system 6 may be eliminated. Data is then compacted by hosts 2, or simply not compacted before storage on tape 11. Format control 7 translates the arrangement of data between that of hosts 2 and that of tape 11. For example, format control 7 may block several logical data records received from hosts 2 into a single physical data record on tape 11. Write/read circuits 12 include the circuits to operate head 13, and will be described further herein. Head 13 includes magnetic write transducers and magnetic read transducers (not shown in FIG. 1 for convenience). Each pair of write and read transducers is used to write to and read from one of a series of data tracks on tape 11. Tape 11 is any magnetic tape compatible with drive 10.

Commands are exchanged between channel adaptors 5, a command unit 8, a motion control 14, and a tape path 15. Command unit 8 controls the operation of subsystem 3. In combination with motion control 14, command unit 8 controls the movement and position of tape 11. Motion control 14 is coupled to tape reels 16 and 17, and other components of tape path 15 for such movement and positioning of tape 11. Bearing guides 18 and 19 properly align tape 11 relative to head 13. In combination with compaction system 6 and format control 7, command unit 8 controls the flow of data between channel adaptors 5 and tape 11.

Except as described further herein, the remaining features of subsystem 3 are known. In the IBM 3490 Magnetic Tape Subsystem, subsystem 3 may be divided into two or more physical boxes. At least one box is a control unit 4, including channel adaptors 5, compaction system 6, format control 7, and command unit 8. At least one other box is a tape drive 10, including write/read circuits 12, motion control 14, and tape path 15.

The physical locations of the aforementioned components (or parts thereof) of subsystem 3 are not relevant to the invention and may thus be different in alternate embodiments thereof.

Figure 2:
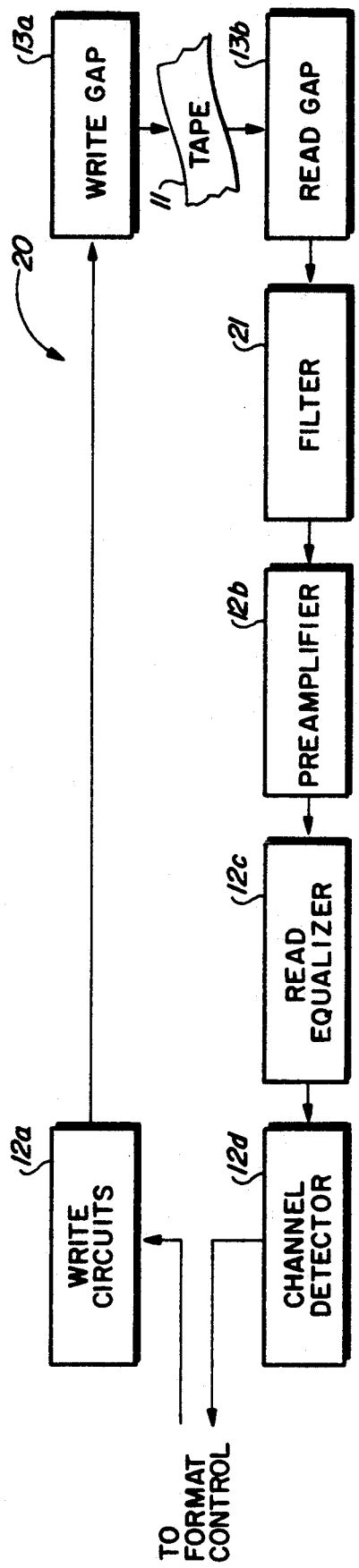
FIG. 2 is a magnetic tape subsystem of FIG. 1 showing increased detail of the recording channel.

Referring to FIG. 2, a recording channel 20 of subsystem 3 will now be described. Recording channel 20 includes tape 11, write/read circuits 12, and head 13. To write data to tape 11, write signals are transmitted through the write circuits 12a to write transducer 13a of head 13. Write circuits 12a include those performing any of several recording channel operations on the data bit stream, such as write equalization and data code conversion, which are well known. Write gap 13a magnetically records the data on tape 11. Any known recording format may be used on tape 11 and as such is not part of the invention.

To read data from tape 11, read signals are generated from tape 11 by magnetic read transducer 13b of head 13. The read signals are transmitted through read circuits of write/read circuits 12, including a preamplifier 12b, a read equalizer 12c, and a channel detector 12d. Preamplifier 12b amplifies the read signal while minimizing noise. Read equalizer 12c converts the read signal to an analog signal of a desired shape. Channel detector 12d determines whether the analog output from read equalizer 12c represents a bit value of zero or one. In an alternate embodiment, the recording channel can be made digital in nature by inserting an analog to digital converter between preamplifier 12b and read equalizer 12c. The physical location and further details of the aforementioned components are known and are not provided herein as they are not part of the invention.

Figure 3:
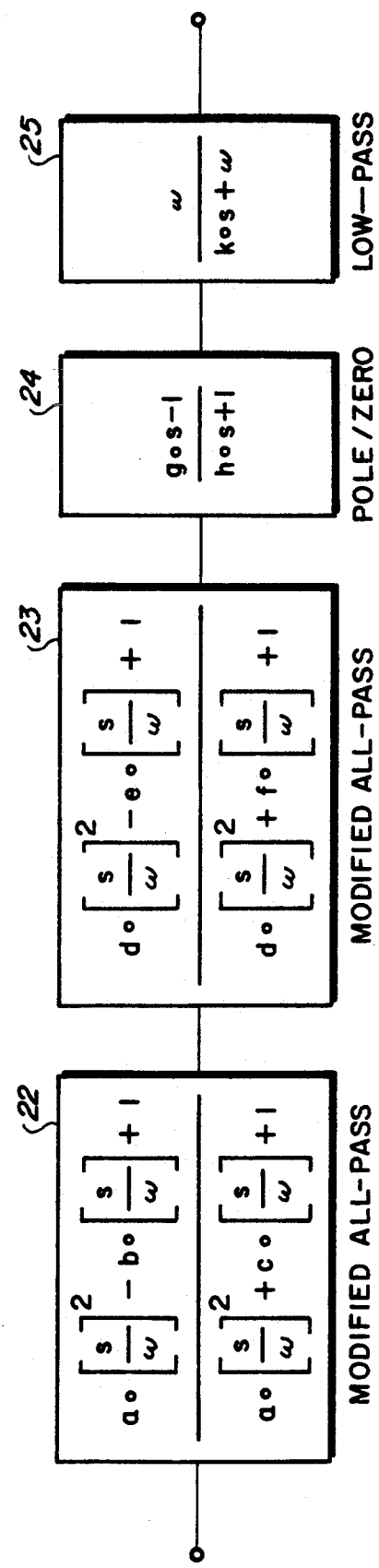
FIG. 3 is an electronic filter of FIG. 2.

An electronic filter 21 is also included in the read side of recording channel 20. Although filter 21 is shown in FIG. 2 between read transducer 13b and preamplifier 12b, filter 21 may be located in channel 20 anywhere between read gap 13b and channel detector 12d. Filter 21 may be any known filter which scales the spacing loss transfer function of equation 1 by the velocity of tape 11 to convert it from a spatial domain to a frequency domain. An example of such a filter is shown in FIG. 3. Filter 21 includes four cascaded filter blocks, including two modified all-pass filters 22 and 23, a low pass or high pass pole-zero filter 24, and a low-pass filter 25, but any number of filter blocks can be used. In FIG. 3, "s" is the Laplace transform operator, $\omega$ is the frequency scale, and "a" through "k" are real coefficients.

With filter 21 coupled into recording channel 20, the resultant frequency domain transfer function is then:

$$G(f) = e^{-\pi S f} \text{ where } f = Dv/2 \qquad (2)$$

and where G(f) is the transfer function for frequency f in megahertz as a function of recording density D in flux changes per micron which results from a change in the physical spacing S in microns due to dropout and a tape velocity of v in meters per second. Equation 2 thus defines variations observed in a read back transfer function as a function of frequency, related to the recording density, as the head-tape spacing is changed from the head-tape spacing which already exists in the system. By selecting additional head-tape spacing S, the frequency domain transfer function is computed and the filter required is designed. Upon insertion of the filter, dropout is then simulated. Such simulation allows for an assessment of recording channel operation with a particular amount of dropout which is in addition to the existing head-tape spacing, including a margin to failure of magnetic tape head 13 or other components of recording channel 20. The specific component which has degraded can be located by a series of simulations with filter 21 in which the components of recording channel 20 are exchanged with the corresponding components from a functional subsystem.

Because the filter is completely electronic, dropout simulation can be performed during development and manufacture, or for maintenance purposes in the field. During normal operations filter 21 is not connected to subsystem 3. To use filter 21 as a diagnostic tool during development and manufacturing of recording channels, it can be implemented as a separate component on one or more circuit cards. When required for testing a recording channel, filter 21 can be coupled thereto as shown in FIG. 2. Similarly, filter 21 can be coupled into a recording channel already in the field for maintenance purposes. A portable filter 21 is simply connected into the recording channel by maintenance personnel, as required. In addition, filter 21 may be designed into subsystem 3 for self-diagnosis of recording channel performance. Filter 21 may be manually or automatically coupled and decoupled (automatic coupling and decoupling could be provided by command unit 8) throughout the life of subsystem 3, self-diagnostic tests being performed while filter 21 is enabled. If the margin to failure of a recording channel is determined to be beneath a predetermined threshold, an operator can be signalled indicating that recording channel maintenance is required. An example of such maintenance might be the replacement of magnetic head 13, which has degraded from abrasion upon its surface by tape 11 and particulates in tape path 15. The coupling (or enablement) of filter 21 could be arranged to occur periodically, or after a certain amount of use of a recording channel.

While the invention has been described with respect to a preferred embodiment thereof, it will be understood by those skilled in the art that various changes in detail may be made therein without departing from the spirit, scope, and teaching of the invention. For example, the invention could also be used to simulate dropout in other types of peripheral storage device subsystems, such as those including magnetic or optical disk drives (although such other drives are less susceptible to failure from dropout). Accordingly, the invention disclosed herein is to be limited only as specified in the following claims.

What is claimed is:

1. A recording channel for simulating dropout in a peripheral storage subsystem, the subsystem including a recording medium, the recording channel comprising:
   a read transducer;
   read circuits coupled to the read transducer and including a channel detector; and
   an electronic filter coupled between the read transducer and the channel detector, said electronic filter implementing in the frequency domain, the effects of a Wallace spacing loss in the spatial domain.

2. The recording channel of claim 1 further comprising means for automatically coupling and decoupling the filter between the read transducer and the channel detector.

3. The recording channel of claim 1 wherein the read circuits include a preamplifier and a read equalizer coupled between the read transducer and the channel detector.

4. The recording channel of claim 1 wherein the peripheral storage subsystem is a magnetic tape subsystem and the recording medium is magnetic tape.

5. The recording channel of claim 2 wherein the read circuits include a preamplifier and a read equalizer coupled between the read transducer and the channel detector.

6. The recording channel of claim 5 wherein the peripheral storage subsystem is a magnetic tape subsystem and the recording medium is magnetic tape.

7. A peripheral storage subsystem, including a recording medium, comprising:
   a read transducer;
   means coupled to the recording medium for controllably moving and positioning the recording medium relative to the read transducer;
   means coupled to a read head for controllably reading the data stored on the recording medium;
   read circuits coupled to the read transducer and including a channel detector; and
   an electronic filter coupled between the read transducer and the channel detector, said electronic filter implementing in the frequency domain, the effects of a Wallace spacing loss in the spatial domain.

8. The subsystem of claim 7 further comprising means for automatically coupling and decoupling the filter between the read transducer and the channel detector.

9. The subsystem of claim 7 wherein the read circuits include a preamplifier and a read equalizer coupled between the read transducer and the channel detector.

10. The subsystem of claim 7 wherein the recording medium is magnetic tape.

11. The subsystem of claim 8 wherein the read circuits include a preamplifier and a read equalizer coupled between the read transducer and the-channel detector.

12. The subsystem of claim 11 wherein the recording medium is magnetic tape.

* * * * *